(12) United States Patent
Doty

(10) Patent No.: US 7,340,125 B1
(45) Date of Patent: *Mar. 4, 2008

(54) OPTICAL SWITCHES AND SWITCHING METHODS

(75) Inventor: Michael Doty, Albuquerque, NM (US)

(73) Assignee: The MIND Institute, Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/405,989

(22) Filed: Apr. 17, 2006

Related U.S. Application Data

(63) Continuation-in-part of application No. 10/933,644, filed on Sep. 3, 2004, now Pat. No. 7,039,266.

(51) Int. Cl.
*G02B 6/26* (2006.01)
(52) U.S. Cl. .................. 385/16; 385/19; 385/140
(58) Field of Classification Search .............. 385/6, 385/16–20, 140
See application file for complete search history.

(56) References Cited

U.S. PATENT DOCUMENTS

| | | | | |
|---|---|---|---|---|
| 4,774,407 A | * | 9/1988 | Erbe | 385/16 |
| 4,878,729 A | * | 11/1989 | Stewart | 385/18 |
| 5,175,780 A | * | 12/1992 | Sano et al. | 385/47 |
| 5,324,283 A | * | 6/1994 | Heckele | 385/19 |
| 6,529,673 B1 | * | 3/2003 | Liu et al. | 385/140 |
| 2003/0098844 A1 | * | 5/2003 | Melnyk | 345/156 |

OTHER PUBLICATIONS

"Behavioral Lab: Response Recording", http://www.indyrad.iupui.edu/public/lectures/mri/iu_lectures/ufastim... (Circa 2002),1.
"Eloquence—Magnet Room Components", http://www.mridevices.com/Funct/EloquenceMore.asp, (Circa 2002),1-3.
"Experience. Reliability. Innovation. That's Magnitude.", www.intermagnetics.com, InvivoMDE—An Internagnetics Company,(Circa 2002),2.
"fORP: Fiber-Optic Response Pad", http://www.curdes.com/usbforp.htm, Current Designs, Inc.,(Circa 2002,1-4.

(Continued)

*Primary Examiner*—Hemang Sanghavi
(74) *Attorney, Agent, or Firm*—Philip D. Askenazy; Peacock Myers, P.C.

(57) ABSTRACT

A device and method for collecting subject responses, particularly during magnetic imaging experiments and testing using a method such as functional MRI. The device comprises a non-metallic input device which is coupled via fiber optic cables to a computer or other data collection device. One or more optical switches transmit the subject's responses. The input device keeps the subject's fingers comfortably aligned with the switches by partially immobilizing the forearm, wrist, and/or hand of the subject. Also a robust nonmetallic switch, particularly for use with the input device and methods for optical switching.

20 Claims, 3 Drawing Sheets

OTHER PUBLICATIONS

"fORP: Response Pads and Pinting Devices", http://www.curdes.com/handhelds.htm, Current Designs, Inc.,(Circa 2002),1-2.

"IFIS-SA—Magnet Room Components", http://www.mridevices.com/Funct/IFISMore.asp, (Circa 2002),1-3.

"Lumina LP-400 Specifications", http://www.cedrus.com/lumina/specs.htm, (Circa 2002),1-3.

"Lumina MRI Response Pad System", http://www.cedrus.com/lumina/index.htm, (Circa 2002),1.

"Lumina Overview", http://www/cedrus.com/lumina/howitworks.htm, (Circa 2002),1-2.

"Optically-isolated USB Interface", http://hill-server.rowland.org/rurb/components.html, The Rowland Institute for Science,(Circa 2002),1.

"Photon Control—Optical Response Keypad", http://www.curdes.com/handhelds.htm, (Circa 2002),1-4.

"Response Box, Head Restraints", http://www.magconcept.com/mri.html, Mac Design & Engineering,(Circa 2002),1-2.

* cited by examiner

OPTICAL SWITCHES AND SWITCHING METHODS

CROSS-REFERENCE TO RELATED APPLICATIONS

This application is a continuation-in-part application of U.S. patent application Ser. No. 10/933,644, entitled "Nonmetallic Input Device for Magnetic Imaging and Other Magnetic Field Applications", filed on Sep. 3, 2004, now U.S. Pat. No. 7,039,266, and the specification and claims thereof are incorporated herein by reference.

FEDERALLY SPONSORED RESEARCH OR DEVELOPMENT

The U.S. government has a paid-up license in this invention and the right in limited circumstances to require the patent owner to license others on reasonable terms as provided for by the terms of Contract No. DE-FG02-99ER62764 awarded by the U.S. Department of Energy.

BACKGROUND OF THE INVENTION

1. Field of the Invention (Technical Field)

The present invention relates to an input device, which is preferably nonmetallic, and optical switches and switching methods therefore. An embodiment of the present invention is useful for transmitting reactions from a subject being studied or tested using magnetic imaging, including but not limited to functional magnetic resonance imaging (MRI), or for other uses that require the switching and/or transmission of a signal in a magnetic field.

2. Background Art

Note that the following discussion refers to a number of publications and references. Discussion of such publications herein is given for more complete background of the scientific principles and is not to be construed as an admission that such publications are prior art for patentability determination purposes.

There are a number of techniques used to image brain function in a subject individual whose reactions or responses are studied. One such technique, Functional Magnetic Resonance Imaging (fMRI) consists of using a Magnetic Resonance (MR) scanner to image a subject's brain while the subject is presented with a functional task or paradigm. The functional task may comprise auditory and/or visual stimuli. It may be necessary and/or desirable to have the subject respond and make decisions based on the stimuli that are presented to them. The experimenter receives and records subject responses, preferably using the stimulus presentation software used to present the auditory and visual stimuli. Another such technique, Magnetoencephalography (MEG), is another form of magnetic imaging similar to MRI in that they both are imaging tools that use high magnetic fields.

For such applications the subject is situated within the magnet room or magnetic field of the imaging device. Therefore, devices to collect responses from the subject must also be located within the magnetic field. Such input devices must therefore be completely nonmagnetic. It is preferable that the device is entirely nonmetallic as well. Metallic components act as antennas and thus introduce noise, which must be filtered out using, for example, radio frequency (RF) filters.

Therefore, it is preferable that nonmetallic switches, such as optical switches, are used in such input devices. All-plastic input devices which use optical switching via optical cables are manufactured by numerous companies and are known in the art. However these devices have a number of disadvantages. They have a touchpad or keypad configuration, which requires that the subject either hold the device in one hand and operate the switches with the other hand, or that the device rest on a surface and the subject's fingers rest on the switches. This is disadvantageous because for numerous magnetic imaging applications, the subject is not able to operate the device with both hands, or comfortably or stably rest his or her hand on a horizontal surface. Further, with these devices, it is easy for the subject's fingers to move from the switches, for example but not limited to sliding laterally off one or more switches. The subject must frequently reposition his or her fingers, thus interfering with the magnetic imaging data collected. Also, these prior art devices do not immobilize the subject's wrist. This permits wrist movement at any time during the experiment, resulting in motor cortex activation which may be confused with activation that is desired to be recorded. In addition, many such existing devices require electronics, such as an optoelectric converter, to be situated within the magnet room, thus inducing noise in the system and requiring costly filters. Finally, these devices typically use plastic membrane-type switches, which are prone to failure.

Thus there is a need for a nonmetallic input device and nonmetallic switch for use particularly in magnetic imaging applications, or any other application which requires manual switching or signaling in the presence of a magnetic field, which is comfortable, robust, and which prevents the movement of fingers from the switches corresponding to each finger. However, the switches and switching methods of the present invention are useful for non-MRI applications and thus may alternatively comprise metallic parts.

SUMMARY OF THE INVENTION

Disclosure of the Invention

The present invention is of a nonmetallic optical switch comprising a manually operated switching mechanism, a nonmetallic spring, an input optical fiber cable, an output optical fiber cable, and a material configured to block light transmission from the input optical fiber cable to the output optical fiber cable when the switching mechanism is operated. The material, preferably comprising foam, more preferably closed cell foam, is preferably at least partially conformable to the end of the output optical fiber cable, and more preferably is sufficiently conformable to the end to provide a light-tight seal over the end. The material preferably blocks light from entering the output optical fiber cable, and/or preferably blocks light from exiting the input optical fiber cable. The end of the input optical fiber cable preferably comprises an exposed core, preferably wherein insulation has been stripped off the end. The switch preferably further comprises a fiber sensor, preferably which detects a change in the intensity of light transmitted through the output optical fiber cable. The fiber sensor preferably produces a signal when the intensity of light drops below a threshold value. The switch preferably comprises a processor, preferably a computer, for recording the signal.

The present invention is also of a method for blocking light, the method comprising the steps of manually engaging a switching mechanism, reversibly disposing an opaque material on an end of an optical fiber cable, at least partially blocking the light from entering the end, and detecting a change in an intensity of light being transmitted through the optical fiber cable. The method preferably further comprises the step of conforming the material to the end of the optical fiber cable, wherein the material preferably comprises foam. The method preferably further comprises the step of establishing a light intensity threshold value, and preferably further comprises the step of generating a signal when the intensity of light drops below the light intensity threshold. The method preferably further comprises the step of recording the signal.

The present invention is additionally of a nonmetallic input device for collecting responses of a subject, the device comprising a splint removably attachable to the subject, at least one manually operated optical switch aligned with at least one finger of the subject, at least one fiber sensor for detecting optical signals; and one or more fiber optic cables connecting the at least one switch and the at least one fiber sensor, wherein the splint at least partially restricts lateral movement of the at least one finger with respect to the at least one switch; and preferably wherein the splint at least partially immobilizes the wrist of the subject. The input device preferably comprises a processor, preferably a computer, for recording the subject's responses.

The present invention is further of a method of collecting responses of a subject, the method comprising the steps of at least partially restricting lateral movement of at least one finger of the subject, activating at least one nonmetallic optical switch aligned with the at least one finger, detecting a change in an optical signal, and producing a signal in response to the change. The method preferably further comprises the step of immobilizing the wrist of the subject. The method preferably further comprises the step of recording the signal.

The present invention is yet further an optical switch comprising an input optical waveguide, an output optical waveguide, a spring, and a material for at least partially preventing light from being transmitted from the input optical waveguide to the output optical waveguide during operation of the switch. The material is preferably at least partially conformable to at least one of an output of the output optical waveguide or an input of the input optical waveguide. The material preferably comprises foam. At least one of the input optical waveguide or the output optical waveguide preferably comprises an optical fiber cable. The switch is preferably manually operated and preferably further comprises a detector for detecting a change in the intensity of light transmitted through the output optical waveguide. The detector may produce a signal when the intensity of light drops below a threshold value, or produce a signal having a value proportional to the intensity of light. All components of the switch are optionally nonmetallic.

The present invention is also a method for blocking light, the method comprising the steps of reversibly changing a position or a shape of a material to at least partially prevent transmission of light from an input optical waveguide to an output optical waveguide, and detecting a change in an intensity of light being transmitted through the output optical waveguide. The method preferably further comprises the step of conforming the material to at least one of an output of the output optical waveguide or an input of the input optical waveguide. The changing step is preferably performed manually. The method preferably further comprises the step of restoring the position or shape of the material using a spring. The method preferably further comprises the step of generating a signal when the intensity drops below a predetermined threshold value. The method optionally further comprising the step of generating a signal having a value proportional to the intensity. At least one of the input optical waveguide or the output optical waveguide preferably comprises an optical fiber.

The present invention is also a method for transmitting light, the method comprising the steps of transmitting light through an input optical waveguide, reversibly disposing an object proximate to the input optical waveguide, illuminating the object sufficiently so a portion of the light is transmitted to an output optical waveguide, and detecting an intensity of the transmitted light. The object preferably comprises a finger. The method preferably further comprises the step of generating a signal when the intensity of the transmitted light exceeds a predetermined threshold value. The method optionally further comprises the step of generating a signal having a value proportional to the intensity of the transmitted light. At least one of the input optical waveguide or the output optical waveguide preferably comprises an optical fiber. The object optionally covers both an output of the output optical waveguide and the input of the input optical waveguide. The disposing step of the method is preferably performed manually.

An object of the present invention is to provide a nonmetallic input device suitable for use with magnetic imaging systems, or any magnetic field system where switching or response detection within the magnetic field is required.

Another object of the present invention is to provide a robust nonmetallic optical switch for use with the input device of the present invention.

A further object of the present invention is to provide for optical switching methods which don't require mechanical switches.

An advantage of one embodiment of the device of the present invention is that the subject's fingers are comfortably prevented from moving laterally away from the switches corresponding to each finger.

Another advantage of an embodiment of the device of the present invention is that the wrist is substantially immobilized, thus reducing motor cortex activation, thereby improving the accuracy of the experimental results.

A further advantage of the present invention is that no metal parts are required to be in the magnet room, thus greatly reducing signal noise and eliminating the need for filters.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS

Best Modes for Carrying Out the Invention

The present invention is a preferably nonmetallic input device for use in magnetic imaging applications, or any magnetic field system where switching or response detection within the magnetic field is required, which keeps a subject's fingers aligned with the switches of the device. The present invention is further a robust nonmetallic optical switch, and switching methods, for use with the input device. The switches of the present invention may alternatively comprise metallic parts.

As used throughout the specification and claims, "attach" means any method for removably attaching two objects, including but not limited to using a strap, tie, belt, adhesive, adhesive pad, adhesive patch, cuff, clamp, and the like.

As used throughout the specification and claims, "splint" means any device for at least partially immobilizing, or at least partially restricting the movement of, a portion of the body, including but not limited to cast, board, bracer, truss, wrap, and the like.

As used throughout the specification and claims, "light" means any electromagnetic radiation, whether or not in the visible range.

As used throughout the specification and claims, "opaque" means impenetrable by light at an operational frequency or frequencies of light being utilized by a device comprising the opaque element.

As used throughout the specification and claims, a "spring" refers to any device that exerts force when compressed or deformed, including coil springs, flat flexures, and like devices. Any such spring preferably operates at least approximately according to Hooke's law, which states that for small $\Delta x$, $F_x = -k(x - x_0) = -k\Delta x$, where the empirically determined constant k is known as the force constant of the spring, x is the coordinate of the free end of the spring, $x_0$ is the value of x when the spring is not stretched or compressed from its equilibrium condition, and $F_x$ is the force applied on or exerted by the spring.

Figure 1:
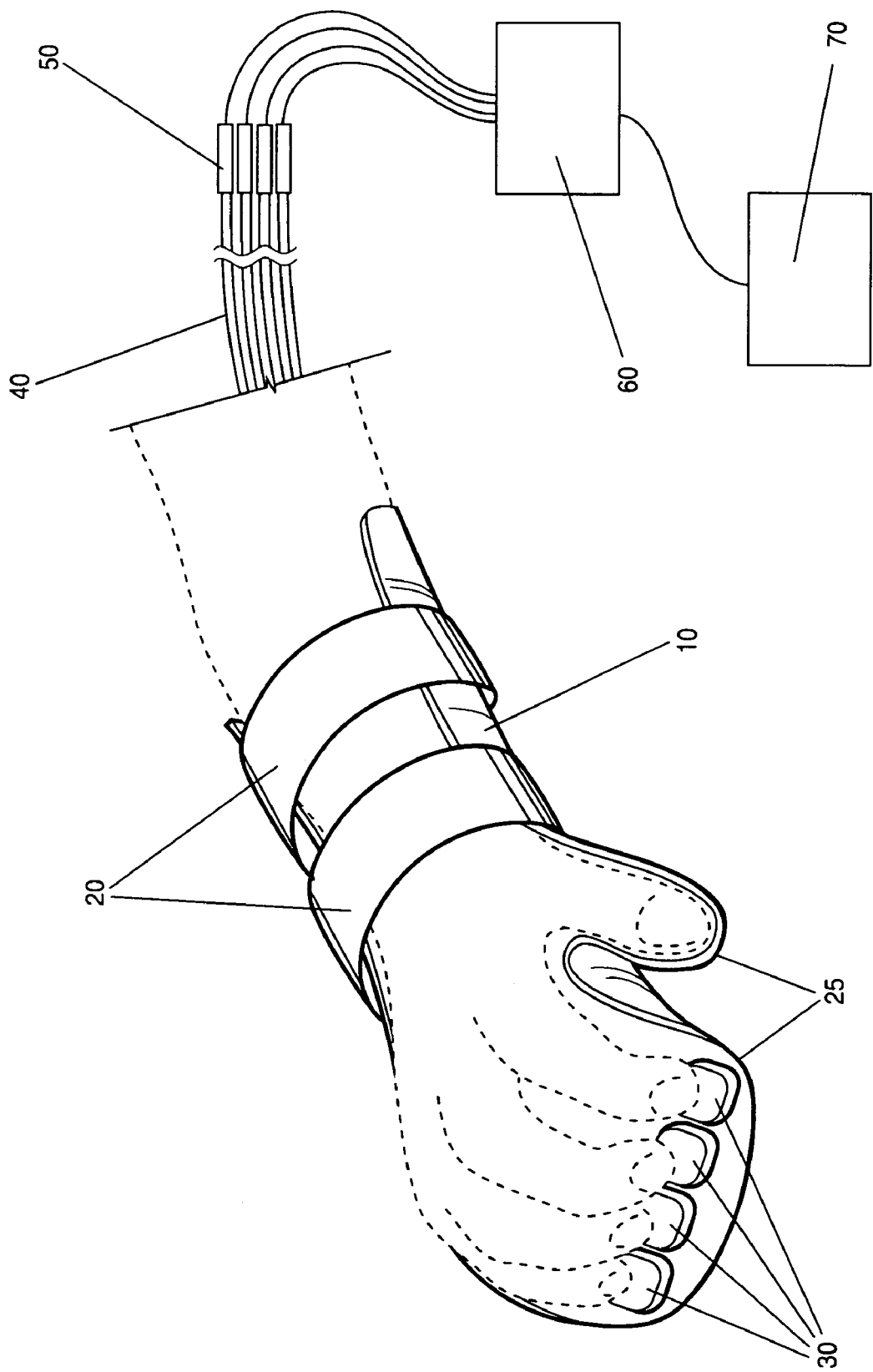
FIG. 1 depicts a preferred embodiment of the present invention.

Referring to FIG. 1, a preferred embodiment of the present invention comprises splint 10. Splint 10 preferably comprises a thermoplastic material and may optionally be modifiable or replaceable for a custom fit. Splint 10 is preferably designed to at least partially immobilize one or more of the subject's forearm, wrist, hand, and fingers. One object of the splint is to at least partially restrict lateral movement of the fingers, whether by restricting movement of individual fingers or by preventing movement of the hand, wrist, and/or forearm. It is preferred that finger lift action is not restrained by the device; since it is typically desirable to measure motor cortex activation directly related to finger movement, a higher finger lift will produce more such desired activation. A preferred splint for use with the present invention is the Preformed Resting Pan Mitt Splint available from Sammons Preston Rolyan; however, any splint or cast may be used. Splint 10 is preferably formed so that all of the subject's fingers, including the thumb, can rest comfortably in the curved position. Splint 10 may be formed for the left or right hands.

Splint 10 is preferably formed to accept the hand, wrist, at least a portion of the forearm, and at least one finger of the subject, and is removably attached thereto, preferably by one or more straps 20. Straps 20 are preferably fastened by a hook and loop-type fastener. Additional straps may optionally be used across the subject's hand, and even across one or more fingers. Optionally, splint 10 may be attached to the subject as desired via adhesive pads. Splint 10 may optionally comprise two halves which separate to insert the subject's arm and then which close to form a cast-type device which substantially encloses the entirety of the subject's forearm, wrist, and optionally the subject's hand and/or fingers. Although splint 10 depicted in FIG. 1 comprises two projections 25, one to receive the subject's thumb and a wide one to receive the subject's other four fingers, splint 10 may alternatively comprise separate projections for each finger, or the projections may instead comprise one or more dividers to separate the fingers.

One or more nonmetallic pushbutton optical switches 30 are preferably attached to splint 10 in positions under each finger, including the thumb. The fingers then operate the switches, thereby providing a response during an experiment or test. Because switches 30 are preferably located under each finger, and because splint 10 at least partially restricts the fingers from moving laterally away from each button 30, the fingers of the subject are always located directly above each corresponding switch. For the purposes herein, lateral movement means movement of a finger which is in a direction substantially parallel to the plane of the surface of splint 10 at the button location. One switch for each finger is preferably provided; however, multiple switches for each finger may be employed. Alternatively, not every finger may have a corresponding switch. Each switch 30 preferably comprises a threaded housing and is preferably secured to splint 10 by being screwed into a hole drilled into splint 10. Although pushbutton switches are preferred, any type of switch may be utilized.

Each switch 30 is preferably connected via two nonmetallic fiber optic cables 40 to a fiber sensor 50. Cables 40 are preferably long enough so that fiber sensors 50 may be located outside the magnet room. Cable 40 preferably has an outer diameter of 2.2 mm with a 1.0 mm diameter solid plastic core; however, any fiber cable may be used. Cables 40 are preferably at least partially covered or held in place against splint 10 by the use of Velcro straps or the like to prevent snagging. Fiber sensor 50 is a device which emits and senses light. The FX-301 Digital Fiber Sensor, available from Sunx Sensors USA, is preferably used for fiber sensor 50, although any sensor may be used.

Figure 2:
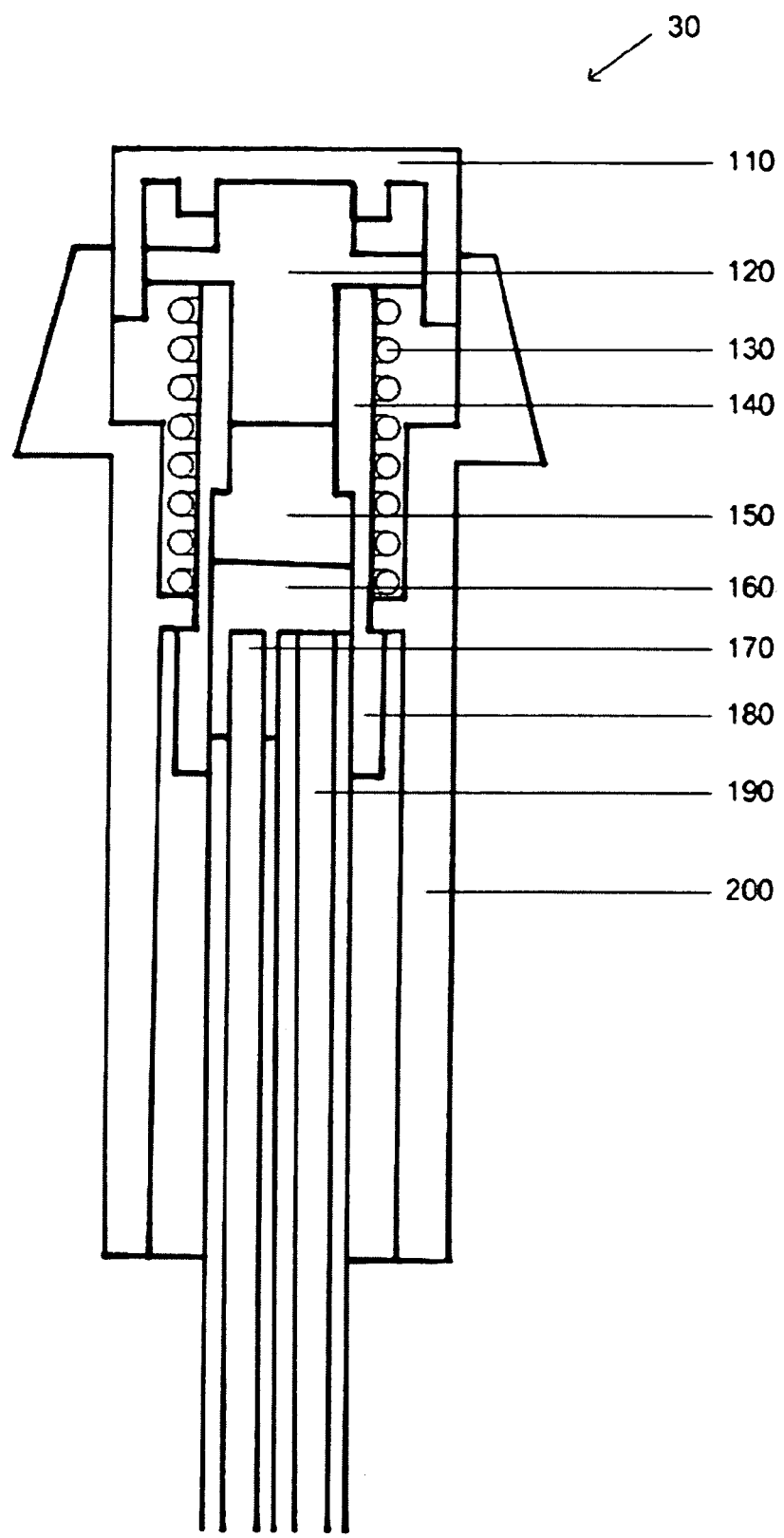
FIG. 2 is a cross section of a preferred embodiment of the nonmetallic switch of the present invention.

FIG. 2 depicts a cross-section of a preferred embodiment of switch 30. Housing 200 of switch 30 is preferably substantially plastic, nylon, or otherwise nonmetallic; any commonly available pushbutton-based switch may be used. Alternatively, a switch based on a different switching mechanism, including but not limited to a rocker switch or a toggle switch, may be utilized. Typical pushbutton switches with plastic housings comprise metallic contacts and springs. Thus in the switch of the present invention the metallic contacts and other metallic parts are preferably removed and the metallic spring is preferably replaced with a nonmetallic, preferably plastic, spring. However, the metallic parts of the switch may alternately be utilized. A preferred plastic spring is part number J001 available from Kato Spring Inc. The spring is preferably chosen not only to fit into the housing 200 of switch 30 but also for an optimal value of the spring tension. Housing 200 may require further modification to receive input cable 170 and output cable 190, both of which preferably comprise fiber optic cables.

Operation of the preferred embodiment of the invention depicted in FIGS. 1 and 2 is as follows. Fiber sensor 50 sends light through input cable 170 to switch 30. Alternatively another light source may be utilized. Normally spring 130 holds pushbutton 110 in the open position via linkage 120. Guide 140 preferably comprises one or more protrusions 180, optionally configured as a ring having a larger diameter than the top portion of guide 140, which contact a portion of housing 200, preventing pushbutton 110 from popping out of housing 200. However, other means for preventing the pushbutton from traveling too far may optionally be used, including but not limited to a nonmetallic locking ring. In the open position, light enters switch 30 through input cable 170 and illuminates chamber 160. Insulation at the end of input cable 170 is preferably stripped off to expose the fiber core, thereby increasing the intensity of the light entering chamber 160. Light from chamber 160 travels through output cable 190 out of switch 30 to fiber sensor 50.

When pushbutton 110 is pressed, foam 150 is pushed against the end of output cable 190, thereby blocking the light from entering output cable 190 and thus from reaching fiber sensor 50. The amount of light blocked is preferably sufficient to drop the light intensity detected by fiber sensor 50 below a predetermined threshold level, as discussed below. Foam 150 preferably at least partially conforms to the end of output cable 190, and is preferably sufficiently conformable to provide a substantially light-tight seal over end of output cable 190. Foam 150 preferably comprises a dark-colored high memory closed cell foam. The preferable high memory property of foam 150 means that foam 150 quickly returns to its original shape once pushbutton 110 is released. Any nonmetallic material with similar conformability and/or compressibility characteristics may be substituted for foam 150. Alternatively, any nonmetallic or metallic opaque material, including nonconformable or noncompressible materials, may be used in place of foam 150.

In the preferred embodiment, when pushbutton 110 is pressed, foam 150 also partially blocks light from exiting input cable 170 by covering, and preferably at least partially conforming to, the end of input cable 170; however, the stripped fiber core of input cable 170 is left partially exposed. Alternatively, foam 150 and input cable 170 may optionally be configured so that the light is completely blocked from exiting input cable 170 instead of, or in addition to, blocking the light from entering output cable 190. In this alternative, a highly compressible foam may be utilized so that it both covers the end of, and substantially completely surrounds the stripped fiber core portion of, input cable 170 when pushbutton 110 is pressed.

Thus, unlike a typical switch, in this embodiment the optical "circuit" is closed (i.e. light flows) when switch 30 is open. Depressing pushbutton 110 blocks the light, thereby opening the optical circuit. A switch with momentary ON action is preferably used, which in this embodiment means that the light is blocked for as long as the subject holds the pushbutton down. As soon as the subject releases the pushbutton, the optical signal is restored.

Fiber sensor 50 outputs an electrical signal depending on the light intensity it receives. For a preferred embodiment of the present invention, the output electrical signal changes once the intensity of the light received by fiber sensor 50 drops below a threshold value, and changes back again once the intensity increases back above the threshold value. The threshold value is preferably set to be approximately halfway between the light intensity detected by fiber sensor 50 when switch 30 is open (i.e. when pushbutton 110 is released) and the light intensity detected when switch 30 is closed (i.e. when pushbutton 110 is pressed). The electrical signal generated by fiber sensor 50 is preferably passed to interface box 60 and is then passed to a computer or other processor 70 by means known in the art, where the response of the subject is preferably recorded, preferably by recording the time that processor 70 received the electrical signal. Interface box 60 preferably scales and/or otherwise modifies said signals by means known in the art, in accordance with the input requirements of computer or other processor 70.

Figure 3:
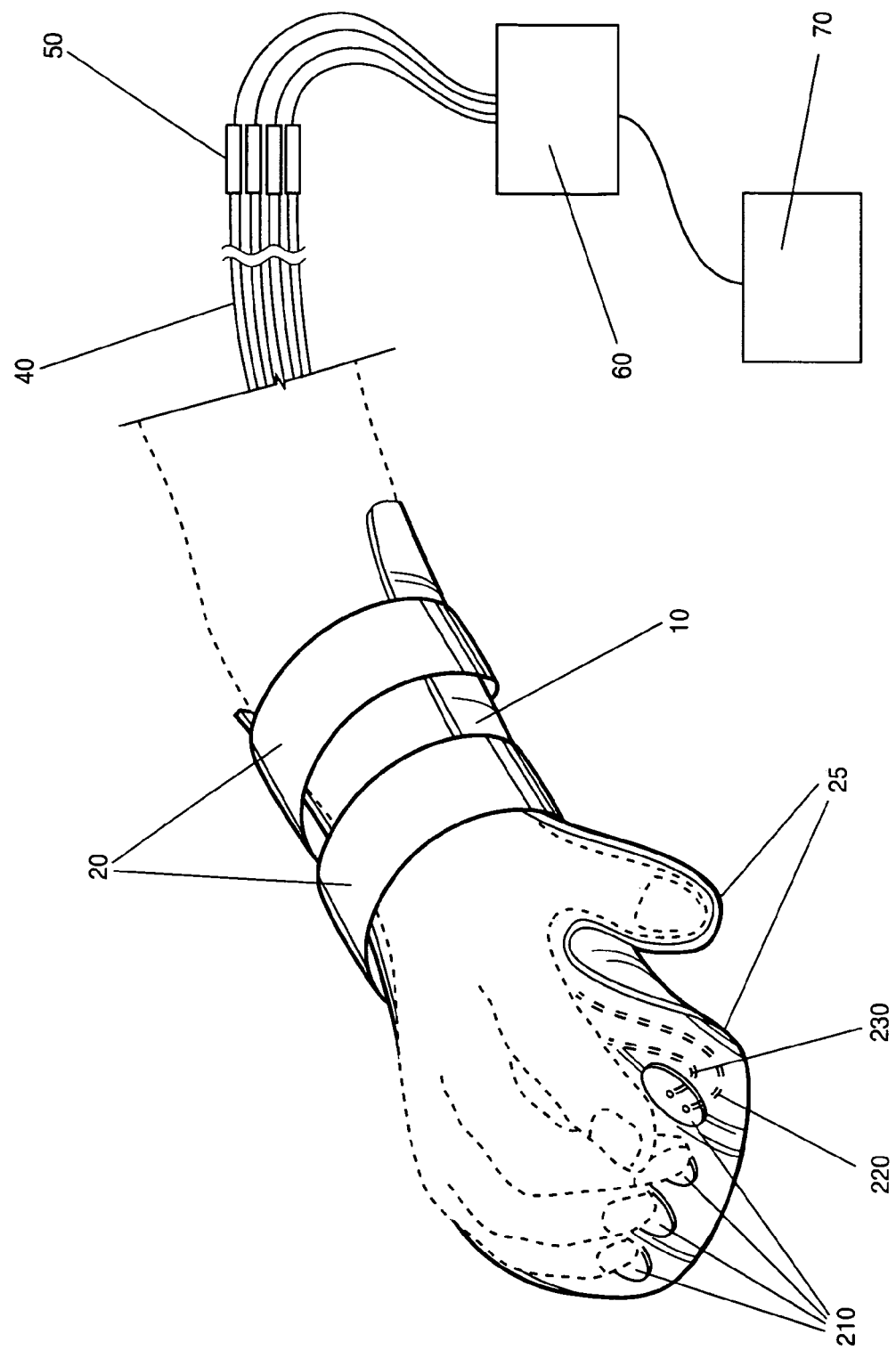
FIG. 3 is a schematic of an alternative switching mechanism of the present invention.

The switch described above typically makes a clicking sound or vibration when it is released too quickly. This can interfere with data collection for some highly sensitive procedures, including but not limited to magneto-encephalography (MEG). FIG. 3 depicts an alternative switching mechanism of the present invention. Each finger for which switching is desired is disposed above the ends of two optical fibers 220, 230. Pads 210 may optionally be employed to help correctly position the fingers. Optical fibers 220, 230 may be flush with the surface of pads 210 if used or the surface of splint 10, or may protrude slightly to provide tactile feedback to the subject or user.

Either optical fiber 220, 230 may be used to transmit light; the other fiber is then used to receive light. When the user's finger is elevated above the two optical fibers, the optical circuit is open; that is, not enough light is received by the receiving fiber to exceed a detection threshold of fiber sensor 50. When the user's finger covers the ends of both optical fibers 220, 230, light from the transmitting fiber illuminates the interior of the tip of the finger. As used throughout the specification and claims, "illuminating" also means internally reflecting, scattering, dispersing, transmitting, conducting, glowing, or the like. The finger is preferably illuminated so that the 'glow' from the finger provides sufficient light entering the receiving fiber to exceed the detection threshold, thus closing the optical circuit and providing an electrical signal.

If there is ambient light in the room, only a single detector optical fiber may be used. In this case the threshold is set such that when the user's finger is blocking the optical fiber, fiber sensor 50 does not output a signal. Conversely, when the user's finger is lifted off the end of the optical fiber, ambient light enters the detector fiber, and fiber sensor 50 outputs a signal.

The above switching embodiments are described as operating to output a digital signal; that is, on or off. In this mode a threshold value is set for the intensity of light detected by fiber sensor 50. If the detected light intensity is above the threshold value, fiber sensor 50 typically outputs a high electrical signal (e.g. 5V). If the detected light intensity is below the threshold value, fiber sensor 50 typically outputs a low electrical signal (e.g. 0V). The electrical signal is then preferably sent to a computer where it is recorded as being in a high or low signal, thus forming a record of the subject's reactions.

The switches and switching methods of the present invention may alternatively be used in an analog mode; that is, outputting an analog signal. In this mode, an optical emitter (typically an LED, but any source may be used) preferably emits light which is transmitted through a fiber optic cable to the switch. Light then enters another fiber optic cable. This light is then preferably detected by an optical detector, including but not limited to a phototransistor. The optical detector outputs an analog electrical signal having a value (including but not limited to voltage) based on the intensity of the light detected by the detector. This analog signal can then be recorded by any commonly used data acquisition system. In this mode, the user's finger is not required to fully block either of the fibers; the light intensity is preferably determined by how close the finger is to the end of either or both of the optical fibers. When a finger is used to perform the switching, light which reflects off the surface of the finger may be detected before the finger completely covers either or both of the fibers.

An object other than a finger may be used to perform switching according to the present invention, in either digital or analog mode. Such object may be reflective (e.g. metallic). In such case light from the transmitting fiber is reflected off the surface of the object. In this case, there may be two positions of the object where no intensity is detected. The first position is when the object is touching or nearly touching the fibers; no light is able to be reflected into the receiving optical fiber. The second position is when the object is sufficiently far away so that the reflected light is not measurable by the detector. In between these positions the reflected intensity preferably depends on the distance the object is from the fibers. This could provide an analog signal; alternatively, one or more thresholds may be set to enable the switch to operate in digital mode.

The switches and switching methods of the present invention may be automatically or remotely controlled, or manual, and may used in any application that requires analog or digital switching, for example on a portable electronic device. In many such applications the switches may comprise metallic parts if desirable for manufacturing or other reasons. In all applications either or both of the optical fibers may be replaced by an optical waveguide or the like.

Although the invention has been described in detail with particular reference to these preferred embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. An optical switch comprising:
   an input optical waveguide;
   an output optical waveguide;
   a spring; and
   a deformable material for at least partially preventing light from being transmitted from said input optical waveguide to said output optical waveguide during operation of the switch;
   wherein said material is at least partially conformable to at least one of an output of said output optical waveguide or an input of said input optical waveguide.

2. The switch of claim 1 wherein said material comprises foam.

3. The switch of claim 1 wherein at least one of said input optical waveguide or said output optical waveguide comprises an optical fiber cable.

4. The switch of claim 1 wherein said switch is manually operated.

5. The switch of claim 1 further comprising a detector for detecting a change in an intensity of light transmitted through said output optical waveguide.

6. The switch of claim 5 wherein said detector produces a signal when said intensity of light drops below a threshold value.

7. The switch of claim 5 wherein said detector produces a signal having a value proportional to said intensity of light.

8. The switch of claim 1 wherein all components of the switch are nonmetallic.

9. A method for blocking light, the method comprising the steps of:
   reversibly deforming a deformable material and conforming the material to at least one of an output of an output optical waveguide or an input of an input optical waveguide, thereby at least partially preventing transmission of light from the input optical waveguide to the output optical waveguide; and
   detecting a change in an intensity of light being transmitted through the output optical waveguide.

10. The method of claim 9 wherein the deforming step is performed manually.

11. The method of claim 9 further comprising the step of restoring the position or shape of the material using a spring.

12. The method of claim 9 further comprising the step of generating a signal when the intensity drops below a predetermined threshold value.

13. The method of claim 9 further comprising the step of generating a signal having a value proportional to the intensity.

14. The method of claim 9 wherein at least one of the input optical waveguide or the output optical waveguide comprises an optical fiber.

15. A method for transmitting light, the method comprising the steps of:
   transmitting light through an input optical waveguide;
   reversibly disposing a finger proximate to the input optical waveguide;
   illuminating the finger sufficiently so a portion of the light from such illumination is transmitted to an output optical waveguide; and
   detecting an intensity of the transmitted light.

16. The method of claim 15 further comprising the step of generating a signal when the intensity of the transmitted light exceeds a predetermined threshold value.

17. The method of claim 15 further comprising the step of generating a signal having a value proportional to the intensity of the transmitted light.

18. The method of claim 15 wherein at least one of the input optical waveguide or the output optical waveguide comprises an optical fiber.

19. The method of claim 15 wherein the object covers both an output of the output optical waveguide and the input of the input optical waveguide.

20. The method of claim 15 wherein the disposing step is performed manually.

* * * * *